(12) United States Patent
Horiba et al.

(10) Patent No.: US 12,477,665 B2
(45) Date of Patent: Nov. 18, 2025

(54) ELECTRICAL JUNCTION BOX

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Issei Horiba, Osaka (JP); Yuki Fujimura, Osaka (JP); Masato Tsutsuki, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 211 days.

(21) Appl. No.: 18/564,297

(22) PCT Filed: Jun. 7, 2022

(86) PCT No.: PCT/JP2022/022877
§ 371 (c)(1),
(2) Date: Nov. 27, 2023

(87) PCT Pub. No.: WO2022/264867
PCT Pub. Date: Dec. 22, 2022

(65) Prior Publication Data
US 2024/0260203 A1 Aug. 1, 2024

(30) Foreign Application Priority Data
Jun. 16, 2021 (JP) .................................. 2021-100148

(51) Int. Cl.
*H05K 5/00* (2025.01)
*H05K 7/20* (2006.01)
(Continued)

(52) U.S. Cl.
CPC ......... *H05K 5/0026* (2013.01); *H05K 5/0047* (2013.01); *H05K 7/20445* (2013.01); *B60R 16/0238* (2013.01); *H02G 3/16* (2013.01)

(58) Field of Classification Search
CPC .............. H05K 5/0026; H05K 5/0047; H05K 7/20445; B60R 16/0238; H02G 3/16
(Continued)

(56) References Cited

U.S. PATENT DOCUMENTS

2003/0030996 A1\* 2/2003 Shiina ................. B60R 16/0238
361/752
2005/0221640 A1\* 10/2005 Saka ...................... H05K 7/026
439/76.2
(Continued)

FOREIGN PATENT DOCUMENTS

| JP | 2005-295724 | 10/2005 |
|---|---|---|
| JP | 2005-348495 | 12/2005 |

(Continued)

OTHER PUBLICATIONS

International Search Report issued in WIPO Patent Application No. PCT/JP2022/022877, dated Aug. 16, 2022, along with an English translation thereof.

*Primary Examiner* — Zhengfu J Feng
(74) *Attorney, Agent, or Firm* — Greenblum & Bernstein, P.L.C.

(57) ABSTRACT

An electrical junction box includes a circuit board, a branch circuit assembly for distributing power to various devices, a housing that accommodates the circuit board and the branch circuit assembly, and a board-side connector module in (Continued)

which a plurality of board-side connectors mounted on the circuit board are formed as a single body. The branch circuit assembly includes an internal circuit including busbars and an electrical component, a case that accommodates the internal circuit, and a plurality of relay connectors that protrude from the case, are electrically connected to the internal circuit, and are respectively connected to the plurality of board-side connectors, and the board-side connectors are connected to the corresponding relay connectors in a state in which the branch circuit assembly and the circuit board are assembled to the housing.

5 Claims, 8 Drawing Sheets

(51) Int. Cl.
*B60R 16/023* (2006.01)
*H02G 3/16* (2006.01)

(58) Field of Classification Search
USPC .......................................................... 361/707
See application file for complete search history.

(56) References Cited

U.S. PATENT DOCUMENTS

| | | | | |
|---|---|---|---|---|
| 2005/0221641 | A1* | 10/2005 | Saka | H05K 7/026 439/76.2 |
| 2013/0341084 | A1* | 12/2013 | Hattori | H05K 7/026 174/559 |
| 2019/0380206 | A1* | 12/2019 | Kimura | H01R 13/7038 |

FOREIGN PATENT DOCUMENTS

| | | |
|---|---|---|
| JP | 2006-187124 | 7/2006 |
| JP | 2019-106770 | 6/2019 |

* cited by examiner

ELECTRICAL JUNCTION BOX

TECHNICAL FIELD

The present disclosure relates to an electrical junction box.

BACKGROUND ART

Patent Document 1 discloses an electrical junction box that is mounted in a vehicle such as an electric automobile or a hybrid automobile, and is used to distribute power from a battery to various in-vehicle devices. The electrical junction box includes a housing constituted by a metal member made of aluminum or the like, and a circuit board that is accommodated in the housing and on which electronic apparatuses such as ECUs are mounted. A plurality of devices such as a branch circuit assembly and electronic apparatuses that are connected to a circuit board are accommodated in the housing, and connectors and terminals that are also provided on terminals of a plurality of wires that respectively extend from the devices are connected to a terminal block of the circuit board and connectors.

CITATION LIST

Patent Documents

Patent Document 1: JP 2019-106770A

SUMMARY OF INVENTION

Technical Problem

The electrical junction box disclosed in Patent Document 1 requires that an operation for connecting connectors and terminals of wires extending from a plurality of devices to the circuit board be performed, and thus an increase in the number of steps involved in the connection operation and the number of components is unavoidable. In addition, there is a need to secure a space for performing the wire connection operation between the circuit board and each device and a space for wire arrangement, and a size reduction of the electrical junction box may not be realized.

In view of this, an electrical junction box with which it is possible to realize, in a space-efficient manner, connection between the circuit board and a plurality of devices that are accommodated in the housing, by reducing the number of steps involved in the connection operation and the number of components.

Solution to Problem

An electrical junction box according to this disclosure includes: a circuit board; a branch circuit assembly for distributing power that is supplied from a battery to various devices; a housing that accommodates the circuit board and the branch circuit assembly; and a board-side connector module in which a plurality of board-side connectors mounted on the circuit board are formed as a single body, in which the branch circuit assembly includes an internal circuit including a busbar and an electrical component, a case that accommodates the internal circuit, and a plurality of relay connectors that protrude from the case, are electrically connected to the internal circuit, and are respectively connected to the plurality of board-side connectors, and the board-side connectors are connected to the corresponding relay connectors in a state in which the branch circuit assembly and the circuit board are assembled to the housing.

Advantageous Effects of Invention

With an electrical junction box according to this disclosure, it is possible to realize, in a space-efficient manner, connection between the circuit board and a plurality of devices that are accommodated in the housing, by reducing the number of steps involved in the connection operation and the number of components.

DESCRIPTION OF EMBODIMENTS

Figure 1:
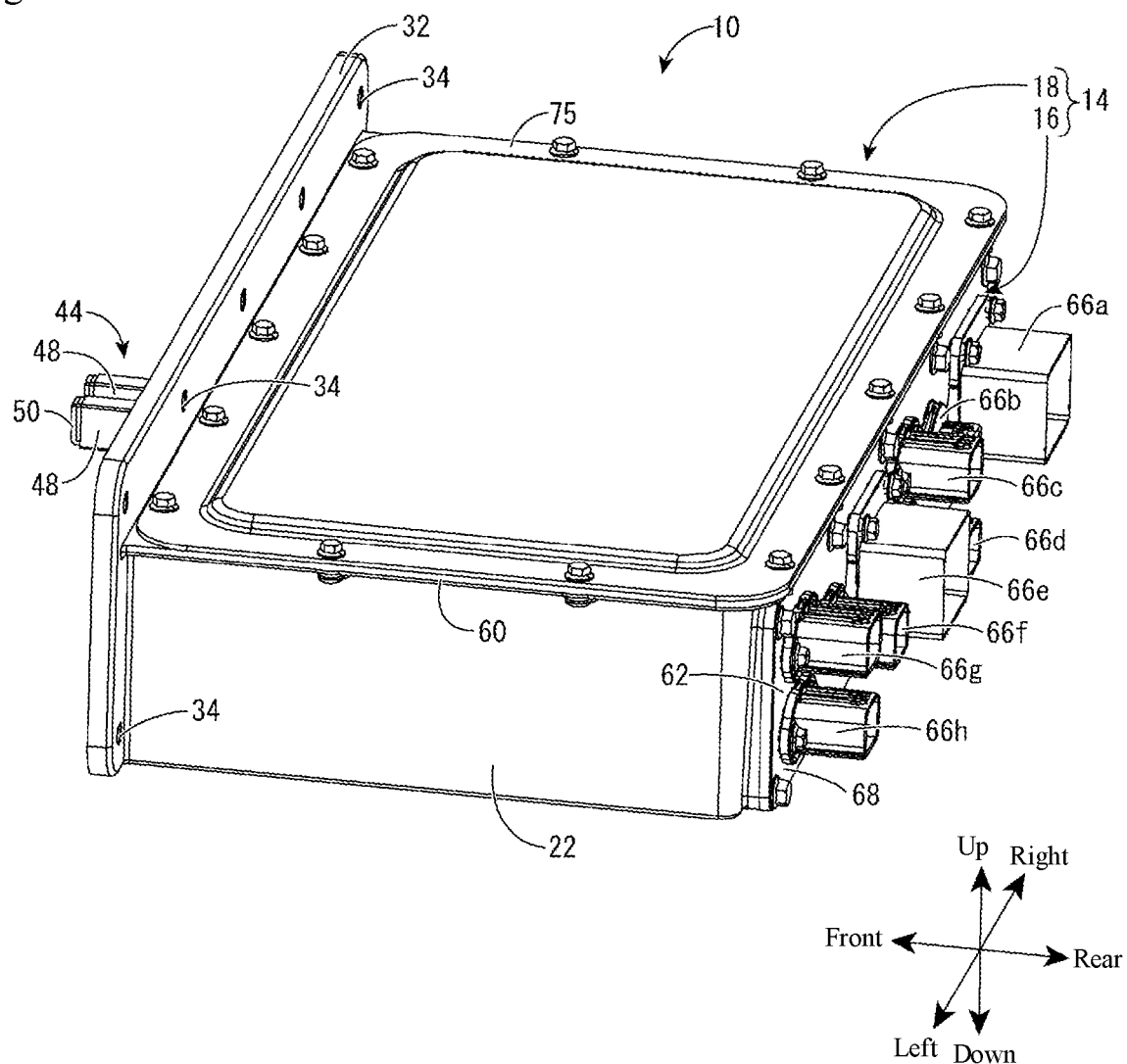
FIG. 1 is a perspective view of an electrical junction box according to Embodiment 1.

Description of Embodiments of the Present Disclosure

First, embodiments of the present disclosure will be listed and described.

An electrical junction box according to this disclosure is
(1) an electrical junction box including: a circuit board; a branch circuit assembly for distributing power that is supplied from a battery to various devices; a housing that accommodates the circuit board and the branch circuit assembly; and a board-side connector module in which a plurality of board-side connectors mounted on the circuit board are formed as a single body, in which the branch circuit assembly includes an internal circuit including a busbar and an electrical component, a case that accommodates the internal circuit, and a plurality of relay connectors that protrude from the case, are electrically connected to the internal circuit, and are respectively connected to the plurality of board-side connectors, and the board-side connectors are connected to the corresponding relay connectors in a state in which the branch circuit assembly and the circuit board are assembled to the housing.

With this structure, the board-side connector module in which a plurality of board-side connectors mounted on the circuit board are formed as a single body is mounted on the circuit board accommodated in the housing, and the branch circuit assembly accommodated in the housing includes the plurality of relay connectors that protrude from the case that accommodates the internal circuit, and are respectively connected to the plurality of board-side connectors, and are electrically connected to the internal circuit. Also, the plurality of board-side connectors and the plurality of relay connectors are collectively connected in a state in which the branch circuit assembly and the circuit board are assembled to the housing. This eliminates the need to connect connectors and terminals of wires extending from devices such as a branch circuit assembly, to a terminal block or the like of a circuit board as in a conventional structure, thus reducing the number of steps involved in a connection operation and the number of components.

Furthermore, by simply assembling the branch circuit assembly and the circuit board to the housing, the plurality of board-side connectors can be respectively connected to the plurality of relay connectors. This eliminates the need to secure, on a circuit board, a work space for connecting connectors and terminals of wires extending from devices such as a circuit assembly and a space for arranging a plurality of wires in the housing as in a conventional structure, and it is also possible to reduce space taken up by the electrical junction box and improve workability.

(2) It is preferable that the electrical junction box includes a metal holding plate that holds the circuit board, and the holding plate is assembled to the housing so as to be capable of transferring heat to the housing. Because the circuit board is held by the metal holding plate and the holding plate is assembled to the housing so as to be capable of transferring heat to the housing, it is possible to build a heat dissipation path through which heat generated by the circuit board is transferred to the housing via the metal holding plate having higher thermal conductivity than that of a synthetic resin or the like. Therefore, this configuration is particularly useful when an electronic apparatus such as a DC/DC converter or an onboard charger that is likely to generate heat is mounted on the circuit board. Note that the metal holding plate is preferably made of a metal having high thermal conductivity, and may be made of aluminum or an aluminum alloy that is relatively light in weight.

(3) It is preferable that the holding plate has a protective wall portion that surrounds an outer peripheral wall portion of the board-side connector module. Because the outer peripheral wall portion of the board-side connector module in which the plurality of board-side connectors are formed as a single body can be protected by the protective wall portion of the holding plate, it is possible to suppress interference with other members of the board-side connector module. Furthermore, deformation when a plurality of board-side connectors and a plurality of relay connectors are fitted to each other can be suppressed or prevented by the holding wall portion, which can contribute to ensuring the state of stable connection between the plurality of board-side connectors and the plurality of relay connectors, and ensuring durability.

(4) It is preferable that an onboard charger is mounted on the circuit board, and the holding plate also holds a transformer connected to the circuit board. Heat generated by the onboard charger mounted on the circuit board and the transformer connected thereto can be transferred to the housing via the holding plate, thus improving heat dissipation properties of the electrical junction box. Furthermore, the transformer and the circuit board can be held by the holding plate, and the stability of connection between the transformer and the circuit board can also be ensured.

(5) It is preferable that the electrical junction box includes: an opening portion extending through a side wall of the housing; a lid that closes the opening portion and is fixed to the side wall; and a plurality of external connection connectors that are fitted to a plurality of through-holes extending through the lid in a plate thickness direction and protrude from an outer surface of the lid, in which the case of the branch circuit assembly is fixed to an inner surface of the lid, a plurality of connection portions provided in the internal circuit of the branch circuit assembly are connected to connection terminals of the corresponding external connection connectors, and an external connection connector module includes the plurality of external connection connectors, the lid, and the branch circuit assembly.

A plurality of through-holes are provided in the lid that closes the opening portion provided extending through the side wall of the housing, and the plurality of external connection connectors are fitted to these through-holes to protrude from the outer surface of the lid. The branch circuit assembly accommodated in the housing is fixed to the inner surface of the lid, and the plurality of connection portions provided in the internal circuit of the branch circuit assembly are connected to the connection terminals of the corresponding external connection connectors. In this manner, the plurality of external connection connectors and the branch circuit assembly having the connection portions connected to the external connection connectors are fixed to the lid separated from the side wall of the housing. As a result, it is possible to reduce dimensional tolerances between the external connection connectors and the connection portions of the branch circuit assembly, and it is possible to directly connect the external connection connectors and the connection portions of the branch circuit assembly to each other without wires therebetween as in a conventional structure. As a result, there is no need to individually connect a plurality of external connection connectors and a plurality of connection portions using wires, thus reducing the number of steps involved in a connection operation and the number of components.

Further, the external connection connector module is formed by assembling the branch circuit assembly and the external connection connectors to the lid separated from the housing. Therefore, it is possible to construct an external connection connector module in advance by performing an operation for connecting the connection portions of the branch circuit assembly and the external connection connectors to each other, outside the housing. Further, assembling of the plurality of external connection connectors and the branch circuit assembly to the housing can be completed through a single operation of fitting the external connection connector module into the opening portion of the housing. This eliminates the need to secure, inside the housing, a work space for individually connecting a plurality of external connection connectors and a plurality of connection portions using wires, and it is also possible to reduce space taken up by the electrical junction box and improve workability.

Two connector modules, namely, the board-side connector module and the outer connection connector module, can be electrically connected to each other via a plurality of relay connectors provided in the branch circuit assembly in this manner, and compared to a conventional structure, it is possible to further advantageously provide an electrical junction box with which the number of operations for connecting a large number of wires and the corresponding connection portions is reduced, and the production workability can be improved and space taken up by the electrical junction box can be reduced.

Details of Embodiment of the Present Disclosure

A specific example of an electrical junction box according to this disclosure will be described below with reference to the drawings. Note that this disclosure is not limited to these examples, and is defined by the claims, and all changes that come within the meaning and range of equivalency of the claims are intended to be embraced therein.

Embodiment 1

Hereinafter, an electrical junction box 10 according to Embodiment 1 of this disclosure will be described with reference to FIGS. 1 to 8. The electrical junction box 10 is mounted in a vehicle such as an electric automobile or a hybrid automobile (not shown), and distributes power supplied from a battery (not shown) to various devices via a branch circuit assembly 12, for example. Also, the electrical junction box 10 includes a housing 14 that accommodates the branch circuit assembly 12. Note that the electrical junction box 10 can be installed in any orientation, but the following will be described based on the up-down direction, the left-right direction, and the front-rear direction shown in the drawings as the up-down direction, the left-right direction, and the front-rear direction. Also, only some of a plurality of the same members may be given reference numerals, and other members may not be given reference numerals.

Housing 14

Figure 2:
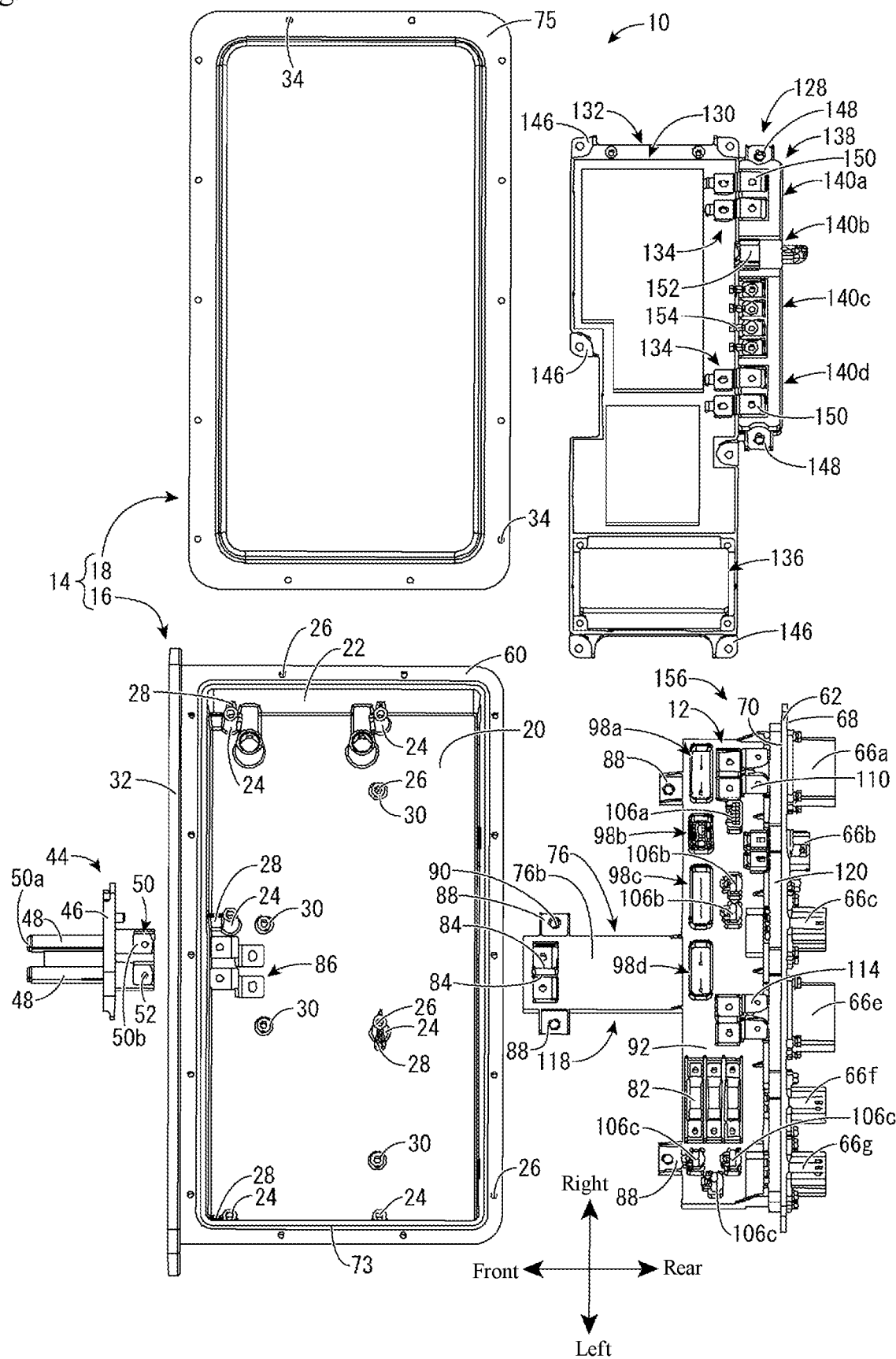
FIG. 2 is an exploded and enlarged plan view of FIG. 1.
Figure 4:
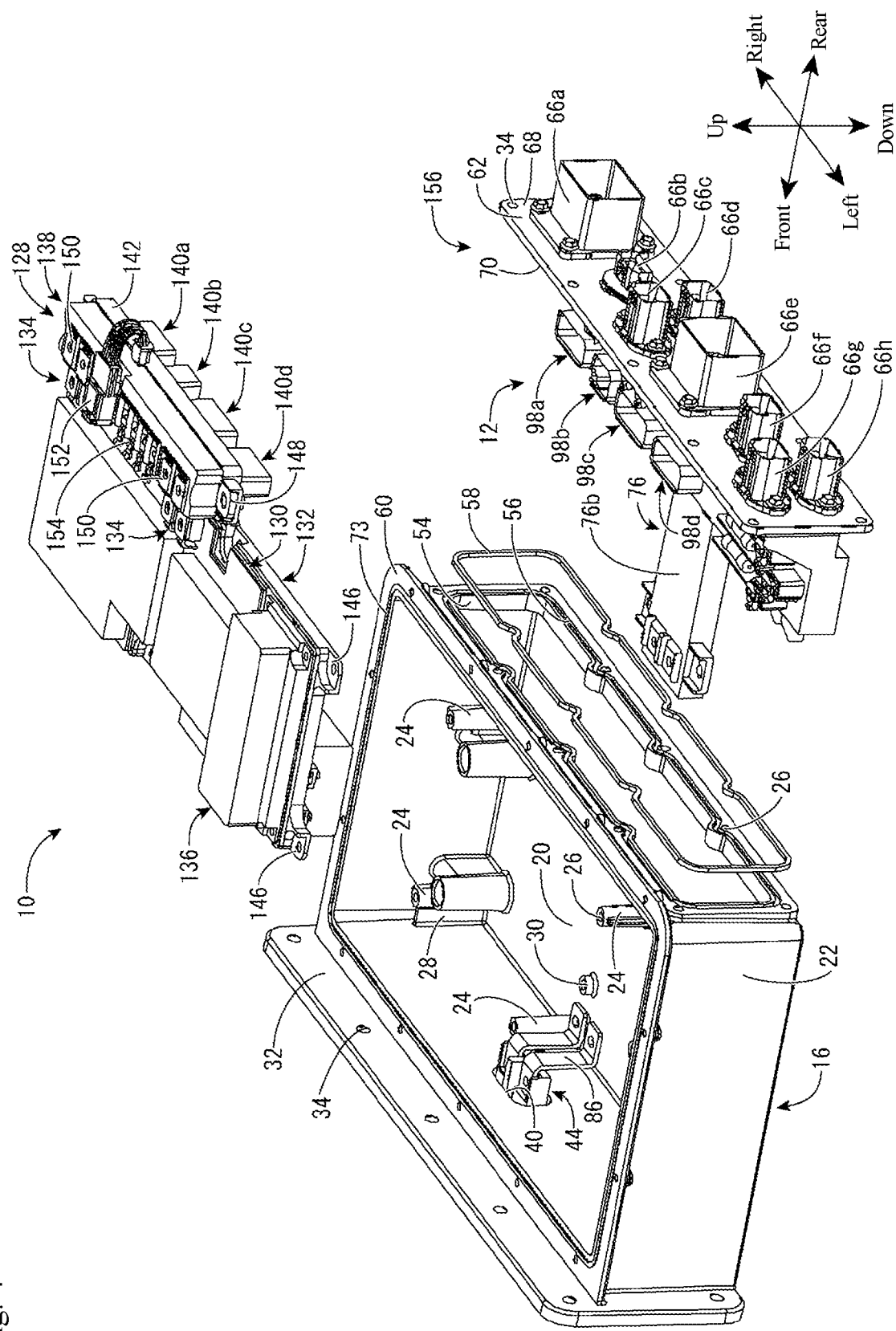
FIG. 4 is an exploded perspective view of FIG. 1 (where a cover portion is not shown and a high voltage battery connector is not detached).

The housing 14 is made of metal, and the housing 14 is made of die-cast aluminum, for example. As shown in FIGS. 1 and 2, the housing 14 includes a housing main body 16 that has a rectangular box shape that has a bottom and is open upward, and a cover portion 18 that covers an upper opening portion of the housing main body 16. The housing main body 16 includes a bottom wall 20, and a side wall 22 that protrudes upward from a peripheral edge portion of the bottom wall 20. As shown in FIGS. 2 and 4, cylindrical holding plate support portions 24 respectively protrude from six positions of the bottom wall 20. The length by which each holding plate support portion 24 protrudes is about half the length by which the side wall 22 protrudes. The holding plate support portion 24 has a tapered structure in which the diameter gradually decreases toward the protruding leading end portion thereof. A bolt fastening hole 26 having a circular cross-section is open upward at the protruding leading end portion of the holding plate support portion 24. The holding plate support portion 24 is provided with a flat plate-shaped reinforcement plate portion 28 that protrudes outward from the outer circumferential surface of the holding plate support portion 24, and is continuous with the side wall 22 or the bottom wall 20. In addition, cylindrical branch circuit assembly support portions 30 respectively protrude from four positions of the bottom wall 20 of the housing 14. The length by which each branch circuit assembly support portion 30 protrudes is ⅒ or less of the length by which the side wall 22 protrudes. A bolt fastening hole 26 having a circular cross-section is open upward at the protruding leading end portion of the branch circuit assembly support portion 30.

Figure 3:
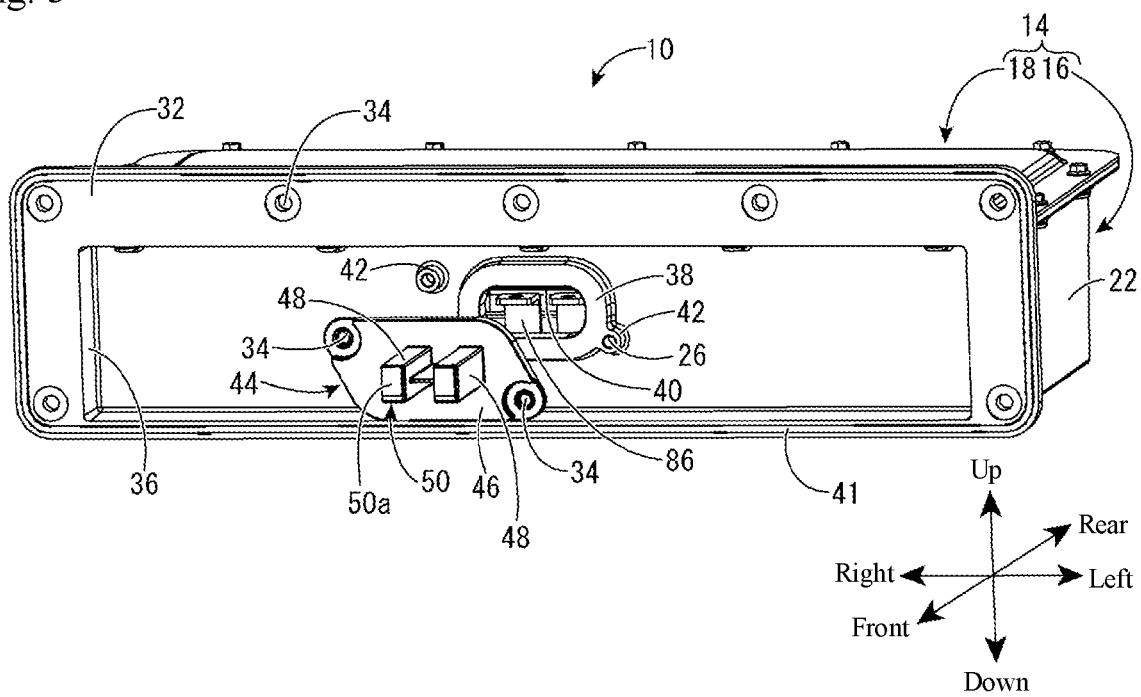
FIG. 3 is an enlarged perspective view of the electrical junction box shown in FIG. 1 as seen from the front left side, with a high-voltage battery connector removed forward.

A battery fixing portion 32 that protrudes upward, leftward, and rightward is formed as a single body with the front side wall 22 of the housing 14. As shown in FIG. 3, for example, the battery fixing portion 32 is provided with bolt insertion holes 34 for fixing the housing 14 to a battery housing (not shown), at seven positions spaced apart from each other in the circumferential direction of the battery fixing portion 32. The front side wall 22 of the housing 14 is provided with a rectangular accommodation recess 36 that is open forward and in which connection portions provided in the battery housing (not shown) are to be accommodated, in a region provided on the center side relative to the battery fixing portion 32. A central portion of the accommodation recess 36 is provided with a protrusion 38 that protrudes forward in an elliptical cross-sectional shape. A high-voltage battery connector insertion hole 40, which is open forward and inward of the housing 14, extends through the central portion of the protrusion 38. A cylindrical high-voltage battery connector support portion 42 having a bolt fastening hole 26 at its protruding end portion is provided on the upper right side and the lower left side of the protrusion 38. Note that, because a front surface of the front side wall 22 of the housing 14 that includes the battery fixing portion 32 is a surface where a battery (not shown) is fixed to the housing, annular sealing rubber 41 is provided at an outer peripheral edge portion of the fixing surface.

High-Voltage Battery Connector 44

As shown in FIG. 3, a high-voltage battery connector 44 has a rectangular flat plate-shaped fixing portion 46. Bolt insertion holes 34 respectively extend through two diagonal portions of the fixing portion 46. The central portion of the fixing portion 46 is provided with two rectangular tubular terminal holding protrusions 48 that protrude forward and rearward and are spaced apart from each other in the left-right direction. A busbar 50, which is bent in an L-shape, is provided in each terminal holding protrusion 48. A battery connection portion 50a of the busbar 50 is exposed from a front end portion of the terminal holding protrusion 48, and a branch circuit assembly connection portion 50b of the busbar 50 is exposed from a rear end portion of the terminal holding protrusion 48 (see FIG. 2). A bolt insertion hole 52 extends through the branch circuit assembly connection portion 50b in a plate thickness direction.

Opening Portion 54

As shown in FIG. 4, almost the entire surface of the rear side wall 22 of the housing main body 16 is cut out to provide the rear side wall 22 with an opening portion 54 that is open rearward and inward of the housing main body and extends through the side wall 22 of the housing main body 16. Bolt fastening holes 26 extend through the side wall 22 of the housing main body 16 respectively at ten positions of the peripheral edge portion of the opening portion 54. A groove-shaped sealing member accommodation portion 56 that is open rearward is provided inward of the bolt fastening holes 26 at the peripheral edge portion of the opening portion 54. An annular sealing member 58 made of rubber is accommodated in the sealing member accommodation portion 56. Specifically, the sealing member 58 is held by a contact surface between the outer peripheral edge portion of the opening portion 54 of the housing main body 16 and a lid 62, which will be described later. As a result, the waterproofness of the opening portion 54 of the housing main body 16 that is closed by the lid 62 is improved by the sealing member 58. The housing main body 16 is provided with an annular flange-shaped portion 60 that extends outward in the left-right direction and in the front-rear direction from an upper opening portion. The flange-shaped portion 60 is provided with bolt fastening holes 26 at fourteen positions spaced apart from each other in the circumferential direction of the flange-shaped portion 60.

Lid 62

Figure 5:
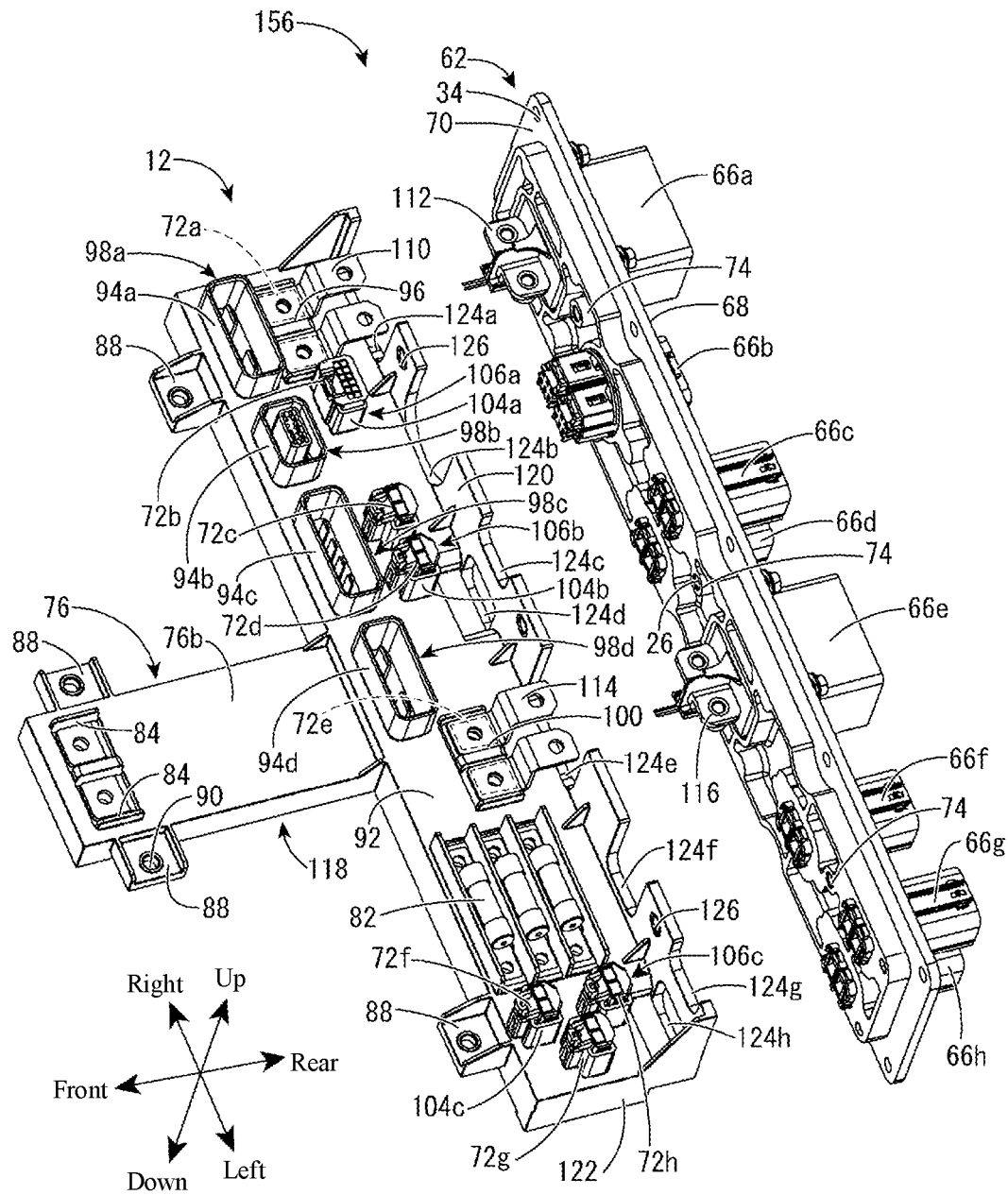
FIG. 5 is an exploded and enlarged perspective view of an external connection connector module shown in FIG. 4.
Figure 6:
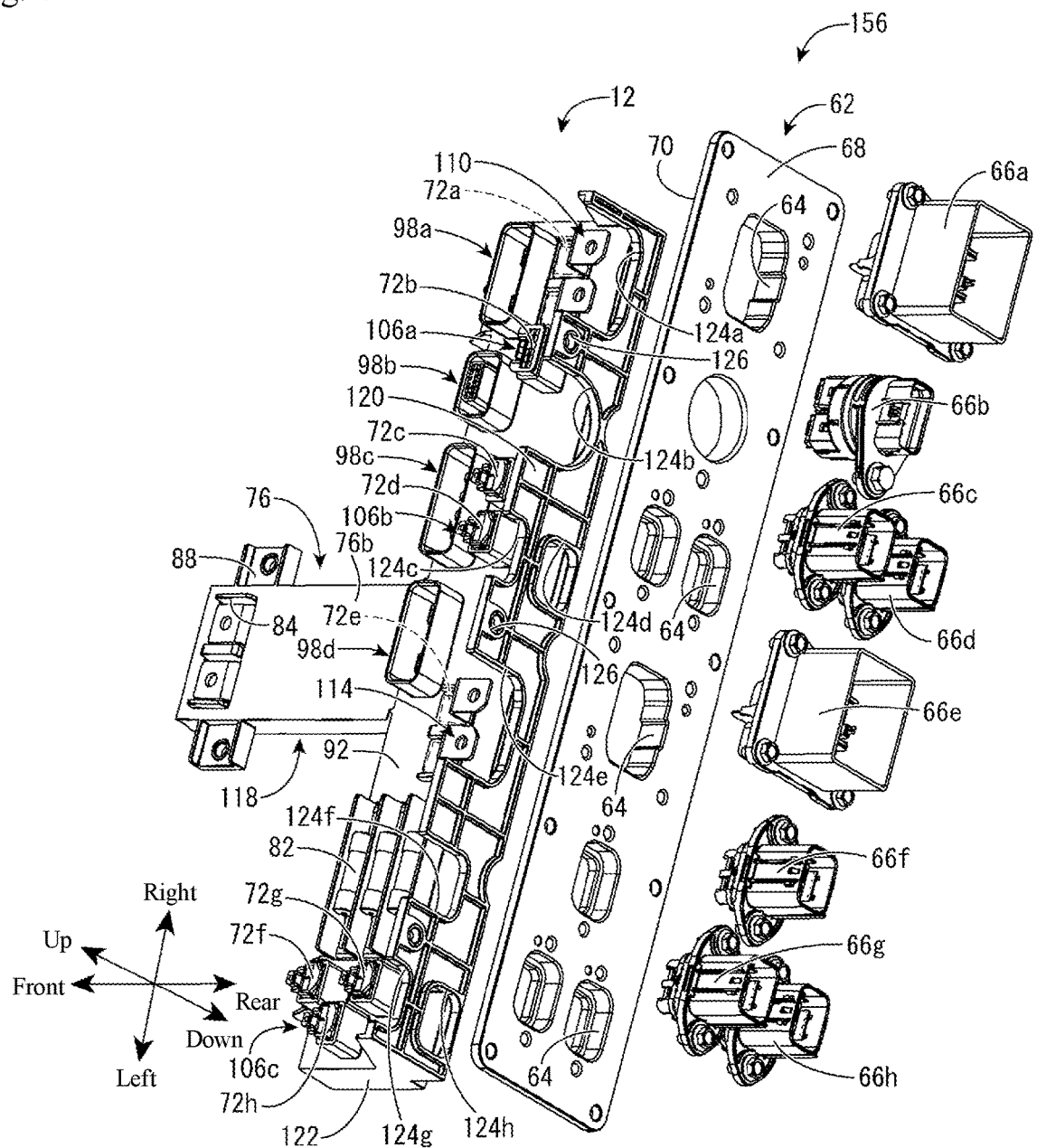
FIG. 6 is an exploded perspective view of the external connection connector module shown in FIG. 5.

The opening portion 54 extending through the rear side wall 22 of the housing main body 16 is closed by the lid 62. The lid 62 has a rectangular flat plate shape. Bolt insertion holes 34 respectively extend through portions of the lid 62 that correspond to the positions of the bolt fastening holes 26 in the peripheral edge portion of the opening portion 54. The bolt insertion holes 34 in the lid 62 are aligned with the bolt fastening holes 26 in the peripheral edge portion of the opening portion 54, and the lid 62 is then bolted and fixed to the rear side wall 22 of the housing 14, as shown in FIG. 1. As shown in FIG. 6, the lid 62 is provided with a plurality of through-holes 64 (eight in this embodiment) extending through the lid 62 in the plate thickness direction. External connection connectors 66a, 66b, 66c, 66d, 66e, 66f, 66g, and 66h are respectively fitted to the through-holes 64. As shown in FIG. 5, for example, the external connection connectors 66a to 66h protrude outward in the thickness direction from an outer surface 68 and an inner surface 70 of the lid 62 in a state in which the external connection connectors 66a to 66h are bolted to and held by the lid 62. As a result, the external connection connectors 66a to 66h connected to connection portions 72a to 72h disposed on a base portion 118 can be stably held using the lid 62. Thus, it is possible to improve the space efficiency and connection stability of an external connection connector module 156, which will be described later. The external connection connectors 66a to 66h protruding from the outer surface 68 of the lid 62 are configured to be connected to connectors connected to various devices (not shown). Also, as shown in FIGS. 2, 5, and 6, the external connection connectors 66a to 66h protruding from the inner surface 70 of the lid 62 are configured to be connected to the connection portions 72a to 72h provided in the branch circuit assembly 12. Furthermore, as shown in FIG. 5, substantially tubular branch circuit assembly fixing portions 74 protrude from the inner surface 70 of the lid 62 at three positions spaced apart in the left-right direction. A bolt fastening hole 26 having a circular cross-section that is open forward is formed at the protruding leading end portion of each branch circuit assembly fixing portion 74.

Cover Portion 18

As shown in FIGS. 1 and 2, the cover portion 18 covering the upper opening portion of the housing main body 16 has a rectangular box shape having a shallow bottom that is open downward. The cover portion 18 is provided with an annular flange-shaped portion 75 that extends outward from a lower opening portion thereof in the left-right direction and in the front-rear direction. The flange-shaped portion 75 has the bolt insertion holes 34 at fourteen positions corresponding to the bolt fastening holes 26 of the housing main body 16. By bolting the cover portion 18 to the housing main body 16, a piece of sealing rubber 73 provided on the upper surface of the side wall 22 of the housing main body 16 is held between the upper surface of the side wall 22 of the housing main body 16 and the flange-shaped portion 75 of the cover portion 18, and thus sealing properties are ensured.

Brach Circuit Assembly 12

Figure 7:
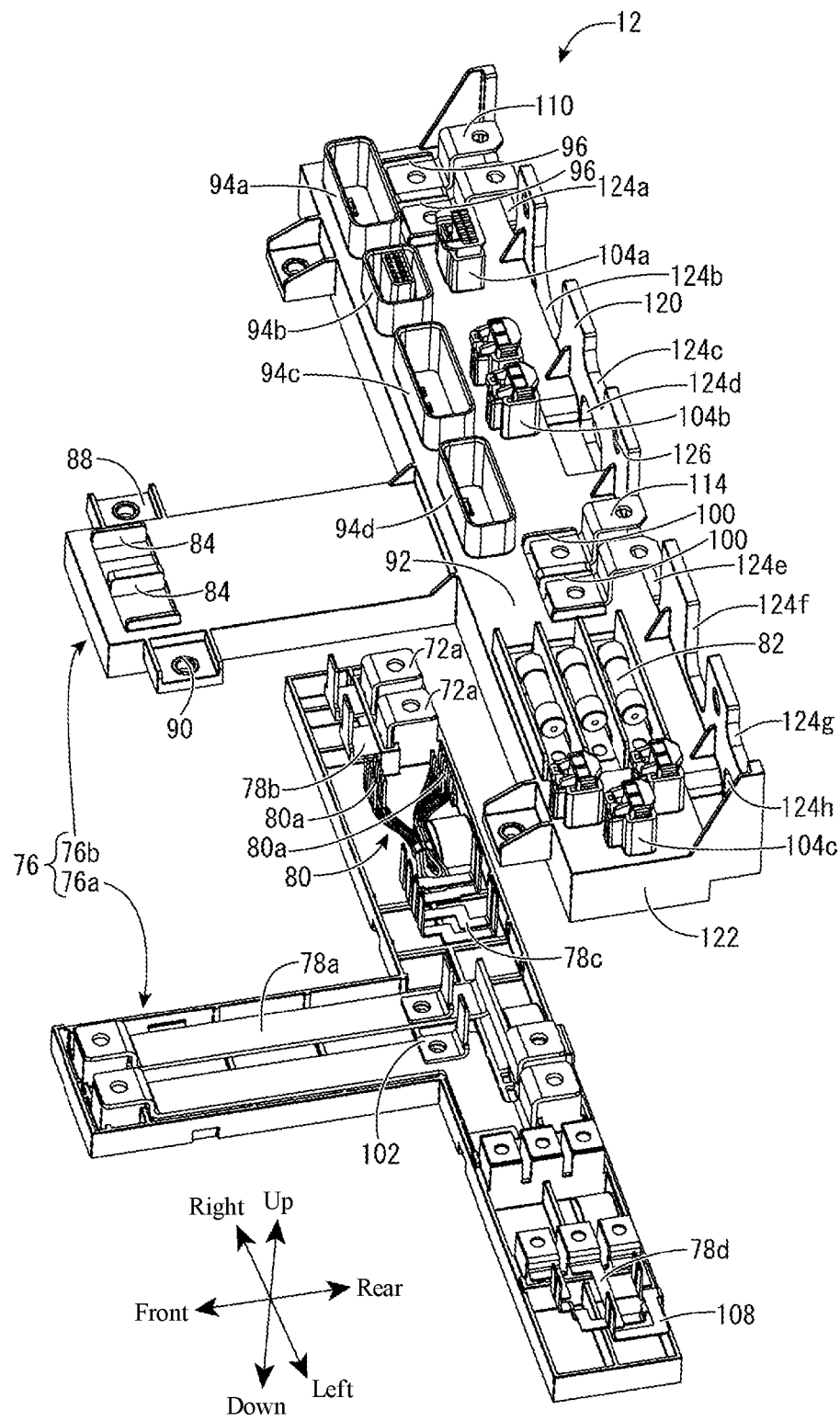
FIG. 7 is an exploded perspective view of a branch circuit assembly shown in FIG. 5.

As shown in FIG. 7, for example, the branch circuit assembly 12 includes a lower case 76a located on the lower side of the branch circuit assembly 12 and an upper case 76b located on the upper side thereof when the branch circuit assembly 12 is mounted in a vehicle, and a case 76 is constituted by the lower case 76a and the upper case 76b. The case 76 is formed by injection molding an insulative synthetic resin into a predetermined shape. The synthetic resin forming the case 76 may include a filler such as glass fibers. As shown in FIG. 2, the case 76 has a substantially T-shape in a plan view, for example. As shown in FIG. 7, for example, busbars 78a extending in the front-rear direction are disposed in the case 76. The busbars 78a are connected to a battery via the high voltage battery connector 44, and a high voltage is applied to the busbars 78a. Busbars 78b connected to a 12V power source, and busbars 78c connected to an AC power source are provided on the rear right side of the busbars 78a. A wire harness 80 for transmitting low-voltage power generated by a board-side connector module 128 from a board-side connector 140b to the external connection connector 66b via a relay connector 98b is accommodated between the busbars 78b and the busbars 78c. Busbars 78d that are connected to the busbars 78a via fuses 82, which are electrical component, are provided on the rear left side of the busbars 78a.

Upper Case 76b

The upper case 76b has a shape that is similar to and slightly larger than that of the lower case 76a in a plan view. The upper case 76b also has a substantially T-shape similar to that of the lower case 76a. Two busbar insertion holes 84 spaced apart from each other in the left-right direction extend through a front end portion of the upper case 76b that extends forward. As shown in FIG. 7, the front end portions of the busbars 78a are bent in a crank shape and exposed to the outside through the busbar insertion holes 84. As shown in FIG. 2, a rear end portion of a relay busbar 86 bent in a crank shape is connected to the front end portion of the corresponding busbar 78a, and the leading end portion of the relay busbar 86 is connected to the corresponding branch circuit assembly connection portion 50b of the high voltage battery connector 44. As a result, a high voltage can be supplied from the battery to the busbars 78a. As shown in FIG. 5, for example, legs 88 protruding outward in a rectangular flat plate shape are provided at left and right ends of the front end portion of the upper case 76b. Further, legs 88 protruding outward in a rectangular flat plate shape are also provided on the front side of left and right ends of the portion of the upper case 76b that extends in the left-right direction. Bolt insertion holes 90 having a circular cross-section respectively extend through central portions of the legs 88.

In addition, four relay connector housings 94a, 94b, 94c, and 94d are provided at positions corresponding to board-side connectors 140a to 140d, which will be described later, on the front right side of a top wall portion 92 that extends in the left-right direction at the rear end portion of the upper case 76b. The four relay connector housings 94a to 94d protrude upward from the top wall portion 92, thus having a rectangular tubular shape that is open in the up-down direction. Two busbar insertion holes 96 extend through the rear of the relay connector housing 94a. The rear end portion of the busbar 78b provided in the lower case 76a is bent in a crank shape and exposed to the outside through the busbar insertion holes 96 (see FIG. 7). A connection portion 72a is constituted by the rear end portion of the busbar 78b exposed to the outside. Also, the leading end portion of the busbar 78b provided in the lower case 76a is bent upward in an L-shape, and is provided in the relay connector housing 94a. The leading end portions of the two busbars 78b are disposed in the relay connector housing 94a, thus forming a relay connector 98a. Also, the leading end portion of a relay busbar 110 bent in a crank shape is connected to the rear end portion of the busbar 78b, and the rear end portion of the relay busbar 110 is connected to a connection terminal 112 in the external connection connector 66a (see FIG. 5). As a result, 12V of power can be supplied from the external connection connector 66a, for example.

As shown in FIG. 7, two busbar insertion holes 100 extend through a central portion in the front-rear direction of the top wall portion 92 that extends in the left-right direction at the rear end portion of the upper case 76b. The rear end portions of the busbars 78a provided in the lower case 76a are bent in a crank shape and exposed to the outside through the busbar insertion holes 100. As shown in FIG. 5, a connection portion 72e is constituted by the rear end portion of the busbar 78a exposed to the outside. Also, the leading end portion of a relay busbar 114 bent in a crank shape is connected to the rear end portion of the busbar 78a, and the rear end portion of the relay busbar 114 is connected to a connection terminal 116 in the external connection connector 66e. As a result, a high voltage of the battery can be supplied from the external connection connector 66e, for example. Two L-shaped busbars 102 are assembled on the rear side of the busbars 78a provided in the lower case 76a. More specifically, one end portion of the busbar 102 is bolted to the rear side of the busbar 78a, and the other end portion of the busbar 102 is bent upward in an L-shape, and is accommodated in the relay connector housing 94d. The other end portions of the two busbars 102 are accommodated in the relay connector housing 94d, thus forming a relay connector 98d.

Further, as shown in FIG. 5, a tubular intermediate connector housing 104a is provided on the rear side of the relay connector housing 94b. The intermediate connector housing 104a has a tubular shape that protrudes upward from the top wall portion 92. A rod-shaped terminal 80a connected to one end portion of a wire harness 80 is accommodated in the relay connector housing 94b, thus forming a relay connector 98b. A rod-shaped terminal 80a connected to the other end portion of the wire harness 80 is accommodated in the intermediate connector housing 104a, thus forming an intermediate connector 106a. A connection portion 72b is formed by the intermediate connector 106a. Two tubular intermediate connector housings 104b are provided on the rear side of the relay connector housing 94c. The intermediate connector housings 104b have a tubular shape that protrudes upward from the top wall portion 92. One end portion of each of the four busbars 78c is bent upward in an L-shape and thus the four busbars 78c are provided in the relay connector housing 94c, thus forming a relay connector 98c. Other end portions of the busbars 78c are bent upward in an L-shape, and two sets of two busbars 78c are respectively disposed in the intermediate connector housings 104b, thus forming two intermediate connectors 106b. The connection portions 72c and 72d are respectively constituted by the two intermediate connectors 106b.

Three tubular intermediate connector housings 104c are provided at the left end portion of the top wall portion 92 extending in the left right direction at the rear end portion of the upper case 76b. Each intermediate connector housing 104c has a tubular shape that protrudes upward from the top wall portion 92. One end portion of the busbar 78d connected to the busbar 78a via the fuse 82 is bent upward in an L-shape, and the busbar 78d is disposed in the intermediate connector housing 104c. In addition, one end portion of a grounding busbar 108 connected to a ground potential is bent upward in an L-shape, and the grounding busbar 108 is disposed in the intermediate connector housing 104c. As a result, intermediate connectors 106c are formed. Connection portions 72f, 72g, and 72h are respectively formed by the three intermediate connectors 106c.

Case 76

The case 76 includes the upper case 76b and the lower case 76a. The case 76 accommodates an internal circuit including the busbars 78a to 78d, and fuses 82, which is an electrical component. The case 76 includes a base portion 118 to which the upper case 76b and the lower case 76a are assembled, and a rising plate portion 120 that extends upward from the base portion 118. Also, the four relay connectors 98a to 98d collectively protrude from a partial region of the base portion 118 of the case 76 of the branch circuit assembly 12, and are respectively connected to four later-described board-side connectors 140a to 140d, thus realizing electrical conduction in the internal circuit in the case 76. Specifically, the board-side connectors 140a to 140d are collectively connected to the corresponding relay connectors 98a to 98d in a state in which the branch circuit assembly 12 and a later-described circuit board 130 are assembled to the housing main body 16.

Rising Plate Portion 120

As shown in FIGS. 5 to 7, the rising plate portion 120 has a rectangular flat plate shape, is connected to the rear end side of side walls 122 of the upper case 76b, and protrudes upward beyond the top wall portion 92. Notch portions 124a, 124b, 124c, 124d, 124e, 124f, 124g, and 124h having a substantially rectangular cross-sectional shape are provided at eight positions of the rising plate portion 120, extending through the rising plate portion 120. The external connection connectors 66a and 66e, which are connected to the connection portions 72a and 72e disposed on the base portion 118 via the relay busbars 110 and 114, are fitted into and supported by the notch portions 124a and 124e. Also, the external connection connectors 66b to 66d and 66f to 66h, which are connected to the connection portions 72b to 72d and 72f to 72h disposed on the base portion 118 via conductive components (not shown) are fitted into and supported by the notch portions 124b to 124d and 124f to 124h. Bolt insertion holes 126 are provided at three positions of the upper portion of the rising plate portion 120, extending through the rising plate portion 120. The bolt insertion holes 126 of the rising plate portion 120 are aligned with the bolt fastening holes 26 of the branch circuit assembly fixing portions 74 of the lid 62, and the rising plate portion 120 is then bolted and fixed in contact with the inner surface 70 of the lid 62. A large area that comes into contact with the lid 62 can be ensured by providing the rising plate portion 120 on the upper case 76b. Therefore, it is possible to improve the fixing strength between the lid 62 and the case 76 of the branch circuit assembly 12. Also, the external connection connectors 66a to 66h connected to the connection portions 72a to 72h disposed on the base portion 118 can be stably held using the rising plate portion 120. Thus, it is possible to improve the space efficiency and connection stability of the external connection connector module 156, which will be described later.

Circuit Board 130

Figure 8:
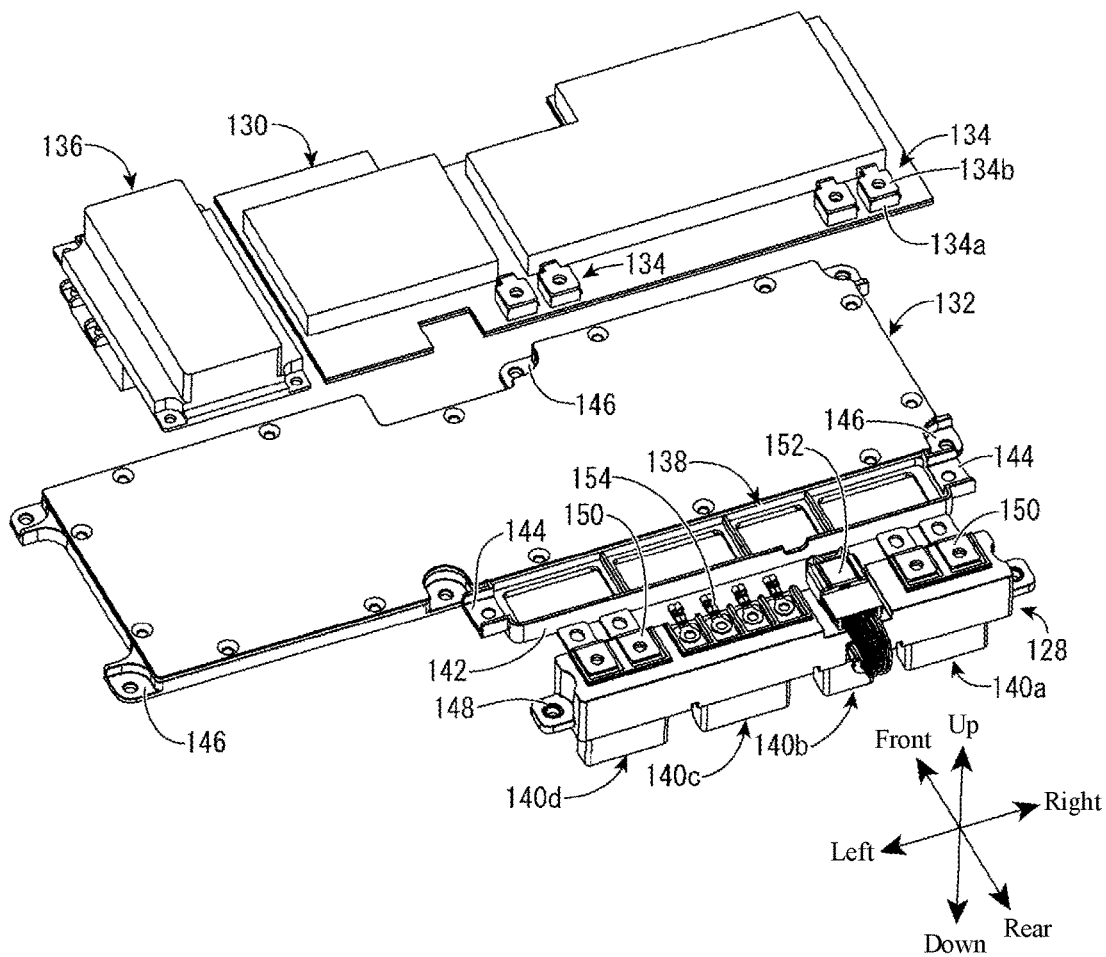
FIG. 8 is an exploded perspective view of a board-side connector module shown in FIG. 4.

The circuit board 130 is accommodated in the housing 14, and a later-described board-side connector module 128 is mounted on the circuit board 130. As shown in FIG. 8, the circuit board 130 is held by a rectangular flat plate-shaped holding plate 132 made of metal. The circuit board 130 is made of a known insulating material such as a glass epoxy resin and has a substantially rectangular flat plate shape, and a power supply pattern is formed on the circuit board 130 through printed wiring (not shown), for example. In this embodiment, an onboard charger is mounted on the circuit board 130. Also, the metal holding plate 132 is preferably made of a metal having high thermal conductivity, and may be made of aluminum or an aluminum alloy that is relatively light in weight. Two sets of two connection portions 134 are provided on the circuit board 130. Each connection portion 134 includes an insulating terminal fixing portion 134a protruding from the circuit board 130, and a terminal 134b. The terminal 134b is bent in an L-shape, and one end portion of the terminal 134b is connected to the printed wiring of the circuit board 130 through soldering or the like. The other end portion of the terminal 134b is placed on a protruding end surface of the terminal fixing portion 134a. For example, 12V of power is supplied from the circuit board 130 to one (right) set of two connection portions 134. The other (left) set of two connection portions 134 are connected to a battery, and high-voltage power is supplied to the circuit board 130, for example.

Holding Plate 132

The holding plate 132 is made of die-cast aluminum, for example. The circuit board 130 is held on the right side of the holding plate 132. A transformer 136 is held on the left side of the holding plate 132. As will be described later, the holding plate 132 is assembled to the housing 14 so as to be capable of transferring heat to the housing 14, and thus heat generated by the circuit board 130 and the transformer 136 can be transferred to the housing 14 via the holding plate 132. Therefore, it is possible to improve the heat dissipation properties of the electrical junction box 10, and to also stably connect the transformer 136 to the circuit board 130. The transformer 136 is connected to the circuit board 130 using a connection structure (not shown). A high voltage of the battery is converted into a desired voltage using the transformer 136. A rectangular frame-shaped board-side connector accommodation portion 138 is provided at a rear end portion on the right side of the holding plate 132, and protrudes rearward. Four board-side connectors 140a, 140b, 140c, and 140d, which are formed as a single body and constitute the board-side connector module 128, are accommodated in the board-side connector accommodation portion 138. A rear peripheral wall of the board-side connector accommodation portion 138 protrudes upward by a longer length than a length by which a peripheral wall of the other portion protrudes upward. A protective wall portion 142 surrounding the outer peripheral wall portions of the four board-side connectors 140a to 140d, which constitute the board-side connector module 128, is constituted by the rear peripheral wall. As a result, it is possible to suppress interference with other components of the board-side connector module 128. Also, deformation that occurs when the board-side connectors 140a to 140d and the relay connectors 98a to 98d are fitted to each other can be suppressed or prevented by the protective wall portion 142. As a result, the protective wall portion 142 can contribute to ensuring the state of stable connection between the board-side connectors 140a to 140d and the relay connectors 98a to 98d, and ensuring durability thereof. In addition, fixing legs 144 protrude outward from left and right end portions of the board-side connector accommodation portion 138. Further, legs 146 are provided at six positions of the outer circumferential edge portion of the holding plate 132.

Board-Side Connector Module 128

The four board-side connectors 140a to 140d are formed as single body to constitute the board-side connector module 128. Legs 148 protrude outward from left and right end portions of the board-side connector module 128. The board-side connector module 128 is fixed to the holding plate 132 by bolting the legs 148 to the fixing legs 144 of the holding plate 132. Also, the four board-side connectors 140a to 140d that constitute the board-side connector module 128 are mounted on the circuit board 130 attached to the holding plate 132. More specifically, the board-side connectors 140a and 140d are respectively bolted and connected to the terminals 134b on the connection portions 134 via two relay terminals 150 that are bent in a crank shape. Further, the board-side connector 140b is connected to a printed wiring connected to a low-voltage power supply line in the circuit board 130 via a relaying connector 152. Furthermore, the board-side connector 140c is connected to a printed wiring connected to an AC power source line in the circuit board 130 via a terminal-equipped wire 154.

Method for Assembling Electrical Junction Box 10

An overview of a method for assembling the electrical junction box 10 according to Embodiment 1 of this disclosure will be described below. First, a housing main body 16 and a cover portion 18 that constitute the housing 14 are prepared. Then, the branch circuit assembly 12, the lid 62, and the external connection connectors 66a to 66h are prepared. The external connection connectors 66a to 66h are fitted to the through-holes 64 of the lid 62, and then the external connection connectors 66a to 66h are bolted to the lid 62. Then, the bolt insertion holes 126 provided in the rising plate portion 120 of the branch circuit assembly 12 are aligned with and bolted to the bolt fastening holes 26 of the branch circuit assembly fixing portions 74 provided on the inner surface 70 of the lid 62. As a result, the case 76 of the branch circuit assembly 12 is fixed to the inner surface 70 of the lid 62. Then, the external connection connectors 66a to 66h protruding from the inner surface 70 of the lid 62 are connected to the connection portions 72a to 72h provided in the internal circuit of the branch circuit assembly 12. The connection terminal 112 in the external connection connector 66a is connected to the connection portion 72a using the relay busbar 110, for example. As a result, the external connection connector module 156 includes the external connection connectors 66a to 66h, the lid 62, and the branch circuit assembly 12.

Then, the branch circuit assembly 12 of the external connection connector module 156 is inserted through the opening portion 54 of the housing main body 16. Thereafter, the bolt insertion holes 34 provided in the lid 62 of the external connection connector module 156 are aligned with the bolt fastening holes 26 provided at the peripheral edge portion of the opening portion 54, and the lid 62 is bolted to the housing main body 16. Also, the legs 88 provided on the branch circuit assembly 12 are aligned with and bolted to the branch circuit assembly support portions 30 that protrude from the bottom wall 20 of the housing main body 16. Further, the high-voltage battery connector 44 and a pair of relay busbars 86 are prepared. The relay busbars 86 are connected to the branch circuit assembly connection portion 50b of the busbar 50 accommodated and disposed in the high-voltage battery connector 44. The high voltage battery connector 44 configured in this manner is fixed to the high-voltage battery connector support portion 42 provided in the housing main body 16. Also, the relay busbars 86 are connected to the busbar 78a disposed in the branch circuit assembly 12. Then, the board-side connector module 128 is prepared. As shown in FIG. 8, for example, the board-side connector module 128 is formed by placing, on the holding plate 132, the circuit board 130 on which the onboard charger is mounted, and the transformer 136. The board-side connector module 128 constituted by the board-side connectors 140a to 140d, which are formed as a single body, is accommodated in and fixed to the board-side connector accommodation portion 138 provided on the rear right side of the holding plate 132. The board-side connectors 140a to 140d are each connected to the printed wiring of the circuit board 130 via the relay terminal 150, the relaying connector 152, and the terminal-equipped wire 154. Then, the holding plate 132 that holds the circuit board 130 to which the board-side connector module 128 is assembled and the transformer 136 is attached to the branch circuit assembly 12 accommodated and disposed in the housing main body 16.

At this time, the legs 146 of the holding plate 132 are placed on the holding plate support portion 24 that protrudes from the bottom wall 20 of the housing main body 16, and bolted and fixed thereto. By bolting the holding plate 132 to the holding plate support portion 24 provided in the metal housing main body 16, the holding plate 132 is assembled to the housing 14 so as to be capable of transferring heat to the housing 14. As a result, it is possible to build a heat dissipation path through which heat generated by the circuit board 130 is transferred to the housing 14 via the metal holding plate 132 having higher thermal conductivity than that of a synthetic resin or the like. Therefore, this configuration is particularly useful when an electronic apparatus such as a DC/DC converter or an onboard charger that is likely to generate heat is mounted on the circuit board 130. Here, power supplied to the circuit board 130 via the board-side connector 140d is converted by the board-side connector module 128, and is output from the other board-side connectors 140a to 140c to the relay connectors 98a to 98c of the branch circuit assembly 12. The external connection connectors 66a to 66h are connected to connectors of various devices (not shown) via the relay connectors 98a to 98c, the connection portions 72a to 72h, and the relay terminals (e.g., relay busbars 110 and 114). Lastly, by overlapping and bolting the flange-shaped portion 75 of the cover portion 18 to the flange-shaped portion 60 of the housing main body 16, the upper opening portion of the housing main body 16 is covered by the cover portion 18, thus completing the electrical junction box 10 shown in FIG. 1. Note that the electrical junction box 10 is used in a state in which the battery fixing portion 32 of the housing 14 is fixed to the housing of a battery (not shown).

According to the electrical junction box 10 of this disclosure having such a structure, the board-side connectors 140a to 140d and the relay connectors 98a to 98d can be collectively connected in a state in which the branch circuit assembly 12 and the circuit board 130 are assembled to the housing 14. This eliminates the need to connect connectors and terminals of wires extending from devices such as a branch circuit assembly, to a terminal block or the like of a circuit board as in a conventional structure. Thus, it is possible to reduce the number of steps involved in a connection operation and the number of components. Furthermore, this eliminates the need to secure, on a circuit board, a work space for connecting connectors and terminals of wires extending from devices such as a circuit assembly and a space for arranging a plurality of wires in the housing as in a conventional structure. Therefore, it is also possible to reduce space taken up by the electrical junction box 10 and improve workability.

The external connection connectors 66a to 66h and the branch circuit assembly 12 having the connection portions 72a to 72h connected to the external connection connectors 66a to 66h are fixed to the lid 62 separated from the side wall 22 of the housing 14. Because the external connection connectors 66a to 66h and the connection portions 72a to 72h are connected via the lid 62, it is possible to reduce the dimensional tolerance between the external connection connectors 66a to 66h and the connection portions 72a to 72h of the branch circuit assembly 12. Further, no wires are required for connection between the external connection connectors 66a to 66h and the connection portions 72a to 72h. As a result, there is no need to connect them using wires, thus reducing the number of steps involved in a connection operation and the number of components. Also, it is possible to form the external connection connector module 156 in advance by performing the operation for connecting the connection portions 72a to 72h of the branch circuit assembly 12 and the external connection connectors 66a to 66h to each other outside of the housing 14. Therefore, assembling of the external connection connectors 66a to 66h and the branch circuit assembly 12 to the housing 14 can be completed through a single operation of fitting the external connection connector module 156 into the opening portion 54 of the housing 14. Therefore, there is no need to secure, in the housing 14, a work space for individually connecting the plurality of external connection connectors 66a to 66h and the connection portions 72a to 72h of the branch circuit assembly 12 using wires. As a result, it is also possible to reduce space taken up by the electrical junction box 10 and improve workability.

It is possible to electrically connect two connector modules, namely, the board-side connector module 128 and the external connection connector module 156, to each other via the relay connectors 98a to 98d provided on the branch circuit assembly 12 in this manner Therefore, it is possible to more advantageously provide the electrical junction box 10 that does not require that connection operation using wires be performed, and with which the production workability can be improved and space taken up by the electrical junction box 10 can be reduced.

OTHER EMBODIMENTS

The technology described in this specification is not limited to the embodiments described above and illustrated in the drawings, and embodiments described below are also included within the technical scope of the technology described in this specification.

(1) Although Embodiment 1 above, in which four board-side connectors 140a to 140d and four relay connectors 98a to 98d are provided, was described as an example, any number or any structure of connectors can be selected. It is also possible to adopt any number or any shape of external connection connectors 66a to 66h.

(2) The holding plate 132 need not be made of metal, and the holding plate 132 may be omitted.

(3) Although the external connection connector module 156 is used in Embodiment 1 above, the external connection connector module 156 is not necessarily required. The connection portions of the branch circuit assembly 12 may be separately connected to the corresponding external connection connectors provided at portions of the housing 14, using wires or the like.

LIST OF REFERENCE NUMERALS

10 Electrical junction box
12 Brach circuit assembly
14 Housing
16 Housing main body
18 Cover portion
20 Bottom wall
22 Side wall
24 Holding plate support portion
26 Bolt fastening hole
28 Reinforcement plate portion
30 Brach circuit assembly support portion
32 Battery fixing portion
34 Bolt insertion hole
36 Accommodation recess
38 Protrusion 40 High-voltage battery connector insertion hole
41 Sealing rubber
42 High-voltage battery connector support portion
44 High-voltage battery connector
46 Fixing portion
48 Terminal holding protrusion
50 Busbar
50a Battery connection portion
50b Brach circuit assembly connection portion
52 Bolt insertion hole
54 Opening portion
56 Sealing member accommodation portion
58 Sealing member
60 Flange-shaped portion
62 Lid
64 Through-hole
66a to 66h External connection connector
68 Outer surface
70 Inner surface
72a to 72h Connection portion
73 Sealing rubber
74 Brach circuit assembly fixing portion
75 Flange-shaped portion
76 Case
76a Lower case
76b Upper case
78a to 78d Busbar
80 Wire harness
80a Terminal
82 Fuse (electrical component)
84 Busbar insertion hole
86 Relay busbar
88 Leg
90 Bolt insertion hole
92 Top wall portion
94a to 94d Relay connector housing
96 Busbar insertion hole
98a to 98d Relay connector
100 Busbar insertion hole
102 Busbar
104a to 104c Intermediate connector housing
106a to 106c Intermediate connector
108 Grounding busbar
110 Relay busbar (relay terminal)
112 Connection terminal
114 Relay busbar (relay terminal)
116 Connection terminal
118 Base portion
120 Rising plate portion
122 Side wall
124a to 124h Notch portion
126 Bolt insertion hole
128 Board-side connector module
130 Circuit board
132 Holding plate
134 Connection portion
134a Terminal fixing portion
134b Terminal
136 Transformer
138 Board-side connector accommodation portion
140a to 140d Board-side connector
142 Protective wall portion
144 Fixing leg
146 Leg
148 Leg
150 Relay terminal
152 Relay connector
154 Terminal-equipped wire
156 External connection connector module

The invention claimed is:

1. An electrical junction box comprising:
   a circuit board;
   a branch circuit assembly for distributing power that is supplied from a battery to various devices;
   a housing that accommodates the circuit board and the branch circuit assembly; and
   a board-side connector module in which a plurality of board-side connectors mounted on the circuit board are formed as a single body,
   wherein the branch circuit assembly includes an internal circuit including a busbar and an electrical component, a case that accommodates the internal circuit, and a plurality of relay connectors that protrude from the case, are electrically connected to the internal circuit, and are respectively connected to the plurality of board-side connectors, and
   the board-side connectors are connected to the corresponding relay connectors in a state in which the branch circuit assembly and the circuit board are assembled to the housing.

2. The electrical junction box according to claim 1, further comprising
   a metal holding plate that holds the circuit board,
   wherein the holding plate is assembled to the housing so as to be capable of transferring heat to the housing.

3. The electrical junction box according to claim 2,
   wherein the holding plate has a protective wall portion that surrounds an outer peripheral wall portion of the board-side connector module.

4. The electrical junction box according to claim 2,
   wherein an onboard charger is mounted on the circuit board, and the holding plate also holds a transformer connected to the circuit board.

5. The electrical junction box according to claim 1, further comprising:
   an opening portion extending through a side wall of the housing;
   a lid that closes the opening portion and is fixed to the side wall; and
   a plurality of external connection connectors that are fitted to a plurality of through-holes extending through the lid in a plate thickness direction and protrude from an outer surface of the lid,
   wherein the case of the branch circuit assembly is fixed to an inner surface of the lid, and a plurality of connection portions provided in the internal circuit of the branch circuit assembly are connected to connection terminals of the corresponding external connection connectors, and
   an external connection connector module includes the plurality of external connection connectors, the lid, and the branch circuit assembly.

* * * * *